US010291012B2

(12) United States Patent
Hanson

(10) Patent No.: US 10,291,012 B2
(45) Date of Patent: May 14, 2019

(54) HIGH SIDE OUTPUT DRIVER

(71) Applicant: Continental Automotive Systems, Inc., Auburn Hills, MI (US)

(72) Inventor: Justin M. Hanson, Rochester Hills, MI (US)

(73) Assignee: Continental Powertrain USA, LLC, Auburn Hills, MI (US)

( * ) Notice: Subject to any disclaimer, the term of this patent is extended or adjusted under 35 U.S.C. 154(b) by 441 days.

(21) Appl. No.: 14/946,033

(22) Filed: Nov. 19, 2015

(65) Prior Publication Data

US 2017/0149233 A1 May 25, 2017

(51) Int. Cl.

*H02H 3/08* (2006.01)
*H03K 19/0175* (2006.01)
*H02H 1/04* (2006.01)
*H02H 3/087* (2006.01)
*H03K 17/08* (2006.01)

(52) U.S. Cl.

CPC .............. *H02H 3/08* (2013.01); *H02H 1/043* (2013.01); *H02H 3/087* (2013.01); *H03K 17/08* (2013.01); *H03K 19/017509* (2013.01); *H03K 2217/0063* (2013.01)

(58) Field of Classification Search

USPC .................................... 361/86–87, 93.7–93.9
See application file for complete search history.

(56) References Cited

U.S. PATENT DOCUMENTS

| | | | | |
|---|---|---|---|---|
| 4,625,271 | A | 11/1986 | Chetty et al. | |
| 5,949,665 | A | 9/1999 | Seong | |
| 7,948,729 | B2 * | 5/2011 | Zhang | H02M 1/32 361/93.7 |
| 2003/0165072 | A1 | 9/2003 | Nadd et al. | |
| 2004/0189229 | A1 | 9/2004 | Nadd et al. | |
| 2008/0211471 | A1 * | 9/2008 | Liao | H02M 3/156 323/282 |
| 2008/0252236 | A1 | 10/2008 | Lee et al. | |
| 2009/0148138 | A1 | 6/2009 | Sciuto et al. | |
| 2014/0078629 | A1 * | 3/2014 | Cortigiani | H03K 17/0822 361/79 |
| 2015/0188431 | A1 | 7/2015 | Cho | |
| 2016/0028313 | A1 * | 1/2016 | Kong | H02M 3/33507 363/21.12 |

FOREIGN PATENT DOCUMENTS

EP 2595317 A1 5/2013

OTHER PUBLICATIONS

Search Report dated May 12, 2016, from corresponding GB Patent Application No. GB1521792.0.

* cited by examiner

*Primary Examiner* — Danny Nguyen

(57) ABSTRACT

A high side output driver includes a controller capable of operating the high side output driver in a charging mode by outputting a pulse width modulated voltage signal. The on time of the pulse width modulated voltage signal is less than a minimum value of a blank time range of the high side output driver.

18 Claims, 3 Drawing Sheets

HIGH SIDE OUTPUT DRIVER

TECHNICAL FIELD

The present disclosure relates generally to high side output drivers, and more particularly to a high side output driver including in-rush control.

BACKGROUND

Powertrain electric control units (ECUs) for vehicles, such as commercial vehicles, often utilize high side drivers as voltage sources for one or more loads. High side drivers are outputs located on a high voltage side of the load. In a typical example, the high side driver is controlled by a pre-drive integrated circuit (IC). The pre-drive IC is configured by a processor, such as a local microprocessor or an engine controller. With certain loads, when the load is added or switched on, a load capacitance is added to the overall circuit. By way of example, smart actuators that are present in many commercial vehicle loads include a large inbuilt capacitance. Alternatively a battery, or other power storage device, can be included within the load and may need to be charged.

In such instances, an initial inrush current related to charging the capacitance or the power storage device can occur. This inrush current can, in some examples, exceed a fault current threshold included within a fault detector and cause a false over-current fault detection by the fault protection device. When an over-current fault is detected, the fault protection device disables the output of the high side driver and prevents current from reaching the loads.

Some existing systems prevent false detection of an over-current fault by utilizing smart output FETs within the high side current driver. Smart output FETs are expensive and can be cost prohibitive. Alternative existing systems utilize discrete circuits to prevent false fault detections. Discrete circuits capable of performing this function are physically large and can be space prohibitive.

SUMMARY OF THE INVENTION

Disclosed is a controller for operating a high side output driver including a first control logic configured to operate a high side output driver in a charging mode by outputting a pulse width modulated voltage signal, the on time of the pulse width modulated voltage signal being less than a minimum value of a blank time range of the high side output driver.

Also disclosed is a high side output driver including: a driver circuitry having an output circuit configured to output a voltage, and a current limiting circuit connecting the output circuit to a voltage output, and a controller controllably coupled to the driver circuitry and including a processor and a memory, the memory storing instructions configured to cause the processor to perform the steps of: initializing the high side output driver, operating the high side output driver in a charging mode, and operating the high side output driver in a standard operations mode.

Also disclosed is a method for detecting a fault condition in a high side output driver including: initializing the high side output driver by at least setting a charge time, placing the high side driver in a charging mode of operations, and operating the high side driver in the charging mode for at least the charge time, comparing an output current of the high side output driver against a fault current threshold when the charge time has elapsed, incrementing a fault counter in response to a fault being detected, returning to the step of placing the high side driver in the charging mode of operations in response to the fault counter being less than or equal to a preset value.

These and other features of the present invention can be best understood from the following specification and drawings, the following of which is a brief description.

DETAILED DESCRIPTION OF AN EMBODIMENT

Figure 1:
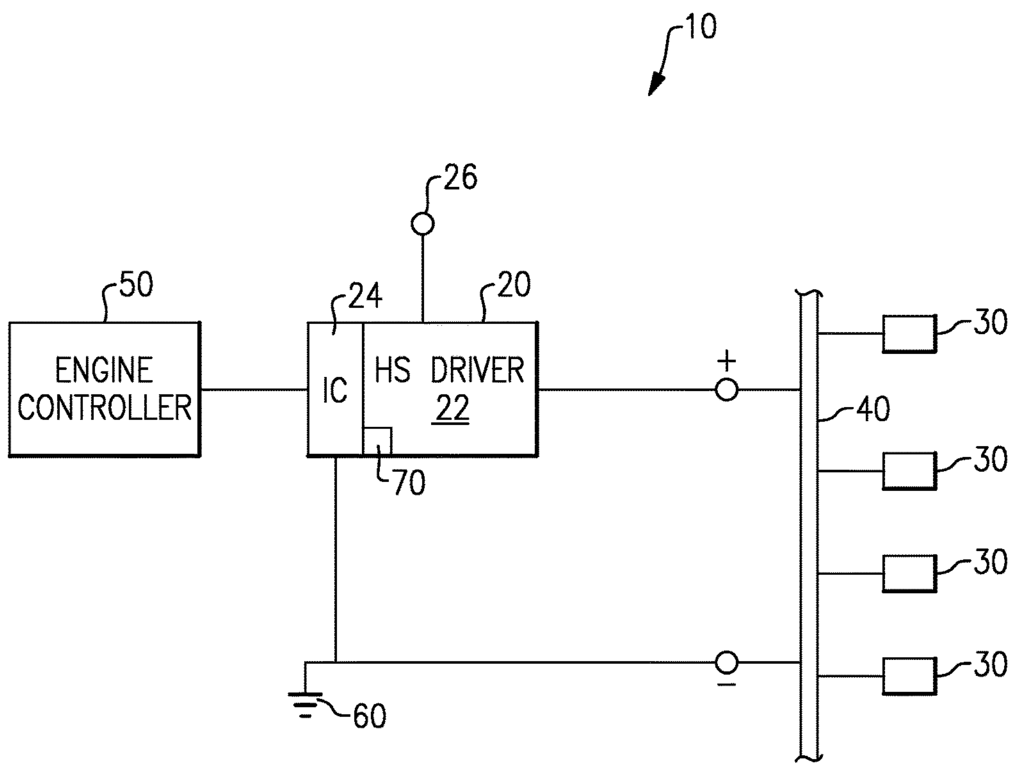
FIG. 1 schematically illustrates an example high side driver configuration for providing power to one or more loads.

FIG. 1 schematically illustrates a high side driver based current controlled voltage source 10 for providing a voltage to multiple loads 30. A high side driver 20 includes driver circuitry 22, alternatively referred to as an output stage, and an integrated circuit 24 controlling the output of the driver circuitry 22. Power is provided to the driver circuitry 22 from a voltage input 26. In a practical implementation, the voltage input 26 can be connected to a vehicle battery, power bus, or any other power supply.

The high side driver 20 provides voltage to a high voltage input of multiple loads 30 through a DC bus 40. The DC bus 40 is connected on a low side to a ground 60. The operations of the current driver circuitry 22 are controlled by the integrated circuit 24. The integrated circuit 24, is further connected to an engine controller 50. The connection to the engine controller 50 allows the engine controller 50 to provide instructions to the integrated circuit 24 which the integrated circuit 24 can then translate into operational controls for the current driver circuitry 22. Alternative implementations can utilize a local microprocessor controller, or any similar controller, in place of the engine controller 50.

The integrated circuit 24 controls the output of the high side driver circuit 22 using a pulse width modulated control signal. When the pulse width modulated control signal is high, power is output from the high side driver circuit 22 to the DC bus 40. When the pulse width modulated control signal is low, no voltage is output from the high side driver circuit 22.

Some loads 30 include an inbuilt capacitance. Other loads 30 can include power storage devices. The inbuilt capacitance or the power storage device charges when the load is connected to the DC bus 40 or the load 30 is turned on. The initial charging can result in an inrush current from the high side current driver 20 that can exceed fault protection thresholds.

In order to protect the loads 30 and the high side driver 20 from over currents resulting from a short to ground fault, the current controlled voltage source 10 includes a fault detection system 70. The ground fault detection system 70 can be any ground fault detection system that detects a ground fault based on a current through the current controlled voltage source 20 exceeding a predetermined value.

The ground fault detection system 70 includes a blanking time controlled by the IC 24. The blanking time is a range of time after a current begins, and before the ground fault detection system 70 checks for the presence of a ground fault. By way of example, a blanking time could be 10-20 μs. The blanking time can be configured within the IC 24 by the controller 50. Some example ICs 24 include multiple possible blanking time ranges, and can be configured depending on the particular needs of the high side driver 20 at a given time.

In practical operation, the driver circuitry 22 can be operated in one of at least three modes, an initialization mode, a charging mode, and an operational mode. When a load is initially switched on, or connected to the output, the controller 50 detects the connection and places the high side driver 20 in the initialization mode. During the initialization mode, the controller 50 configures the integrated circuit 24 as it would for a standard output, with the exception that the IC 24 is configured with the maximum blanking time range allowed by the IC 24. By way of example, if the IC 24 can be configured with a blanking time range of 10-15 μs, 20-25 μs, or 30-35 μs, the IC 24 is set to a blanking time range of 30-35 μs during the initialization mode. The specific blanking time ranges described above are exemplary in nature, and practical implementations can include any blanking time ranges.

Once the integrated circuit 24 has been configured with the maximum blanking time range, the controller 50 causes the integrated circuit 24 to place the high side driver 20 in the charging mode. During the charging mode, the high side driver 20 is controlled with a Pulse Width Modulation (PWM) control signal. The PWM control signal is configured with an on time. The on time is less than the minimum value of the blanking time of the blanking time range that is set during the initialization mode. By way of example, if the blanking time range is 30-35 μs, the duty cycle of the pulse width modulation is adjusted such that the on time of the pulse width modulation signal is less than 30 μs.

The total off time and on time of the PWM signal is dependent on load characteristics and is set by the controller 50. The on time and off time are set such that the amount of charging during the on time of the PWM signal is greater than the amount of discharging during the off time of the PWM signal. In this way, the load capacitance, or the power storage component within the load, is charged over time.

The high side current driver 20 operates as a current controlled voltage source during the charging mode. As such, the output voltage of the current driver circuitry 22 decreases to the voltage required by the load. If the on time of the PWM output were to exceed the blanking time of the fault detection, a false over-current fault would occur due to the inrush current exceeding the over-current fault detection threshold. As the on time is set to less than the blanking time of the fault detection component, the integrated circuit 24 does not check for a short circuit condition while the inrush current is present, and no false detection occurs.

In order to prevent damage to the loads 30 during the inrush period, the current driver circuitry 22 is operated in a current limiting state during the charging mode of operations. The current limiting state prevents current passing through the driver circuitry 22 to the loads 30 from exceeding a pre-determined level.

Once the load is fully charged, or sufficiently charged that the inrush current falls below a fault detection threshold, the controller 50 instructs the integrated circuit 24 to place the driver circuitry 22 in the operational mode. In some examples, the charge status of the load is determined via load sensors.

In alternative examples the charging mode is operated for a predetermined charge period ($t_{charge}$). In these embodiments, the charge period is longer than an expected charge length of any load. During the operational mode, the integrated circuit 24 sets the duty cycle of the pulse width modulation such that the on time of the pulse width modulation signal exceeds the minimum value of the blanking time range. Increasing the on time of the pulse width modulation signal above the minimum value of the blanking time range causes the current output to behave as a typical high side current output stage. In some examples, the pulse width modulation signal is set to 100% duty cycle during the operational model. In some examples, the current limiting component remains on during the operational mode. In such examples, the maximum current draw required by the load, excluding the inrush current, is maintained at a level that is lower than the current limit of the output stage.

Figure 2:
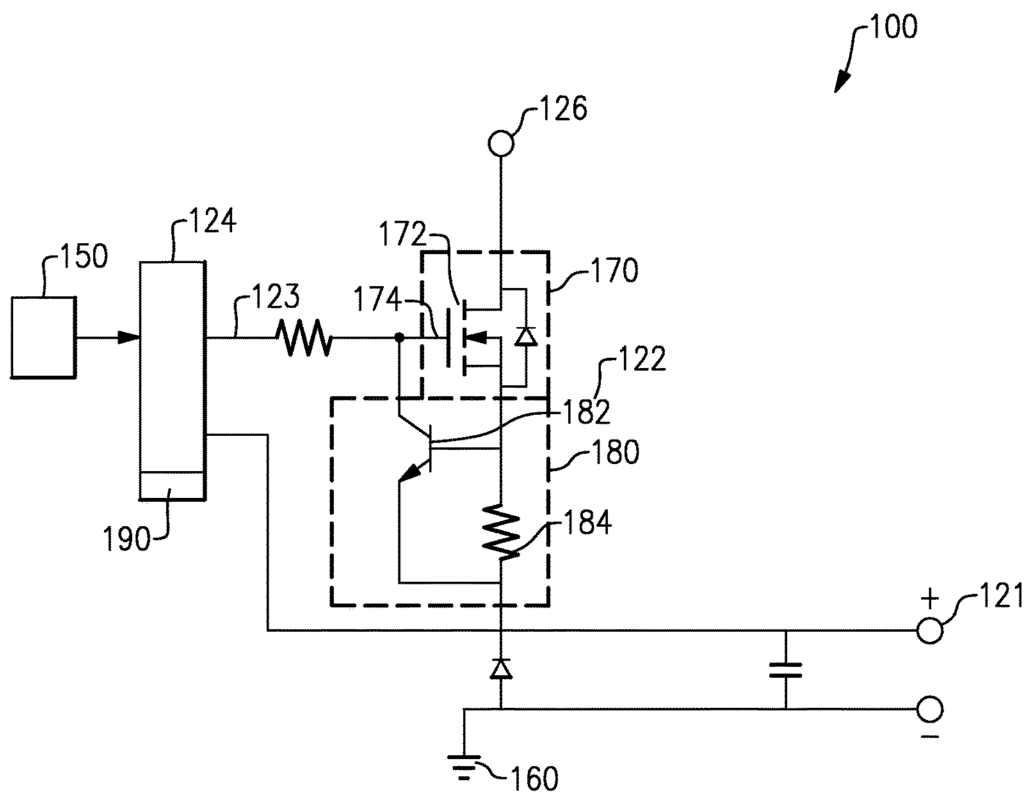
FIG. 2 schematically illustrates one example circuit for implementing the high side driver configuration of FIG. 1.

With continued reference to FIG. 1, and with like numerals indicating like elements, FIG. 2 schematically illustrates one exemplary implementation of the high side driver configuration of FIG. 1. As with the example of FIG. 1, the high side driver 100 of FIG. 2 includes a controller 150 communicating with an integrated circuit 124. The integrated circuit 124, in turn, controls the high side driver circuit 122 to generate a positive voltage output 121.

Included within the high side driver circuit 122 is an output circuit 170. The output circuit 170 includes a transistor 172 connecting a voltage input 126 of the high side driver circuit 122 to the positive voltage output 121. The on/off state of the transistor is controlled by a control input 174 that is connected to a pulse width modulation output 123 from the integrated circuit 124. When the pulse width modulation output 124 is high (i.e. 5 volts), the transistor 172 is on, and the voltage input 126 is connected to the positive voltage output 121. Similarly, when the pulse width modulation signal 124 is low (i.e. 0 volts), the transistor 170 is off, and no voltage is provided to the positive voltage output 121.

Positioned between the output circuit 170 and the high voltage output 121 is a current limiting circuit 180. The current limiting circuit 180 includes a transistor 182 and a resistor 184 arranged in a manner to limit the maximum current that can pass through the current limiting circuit 180. Alternative current limiting circuit designs can be utilized in place of the illustrated current limiter circuit 180 to the same effect.

A fault detection circuit 190 is included in the integrated circuit 124. As with the example of FIG. 1, any fault detection circuit configuration that detects an over-current fault based on a threshold current can be utilized in the example of FIG. 2.

Figure 3:
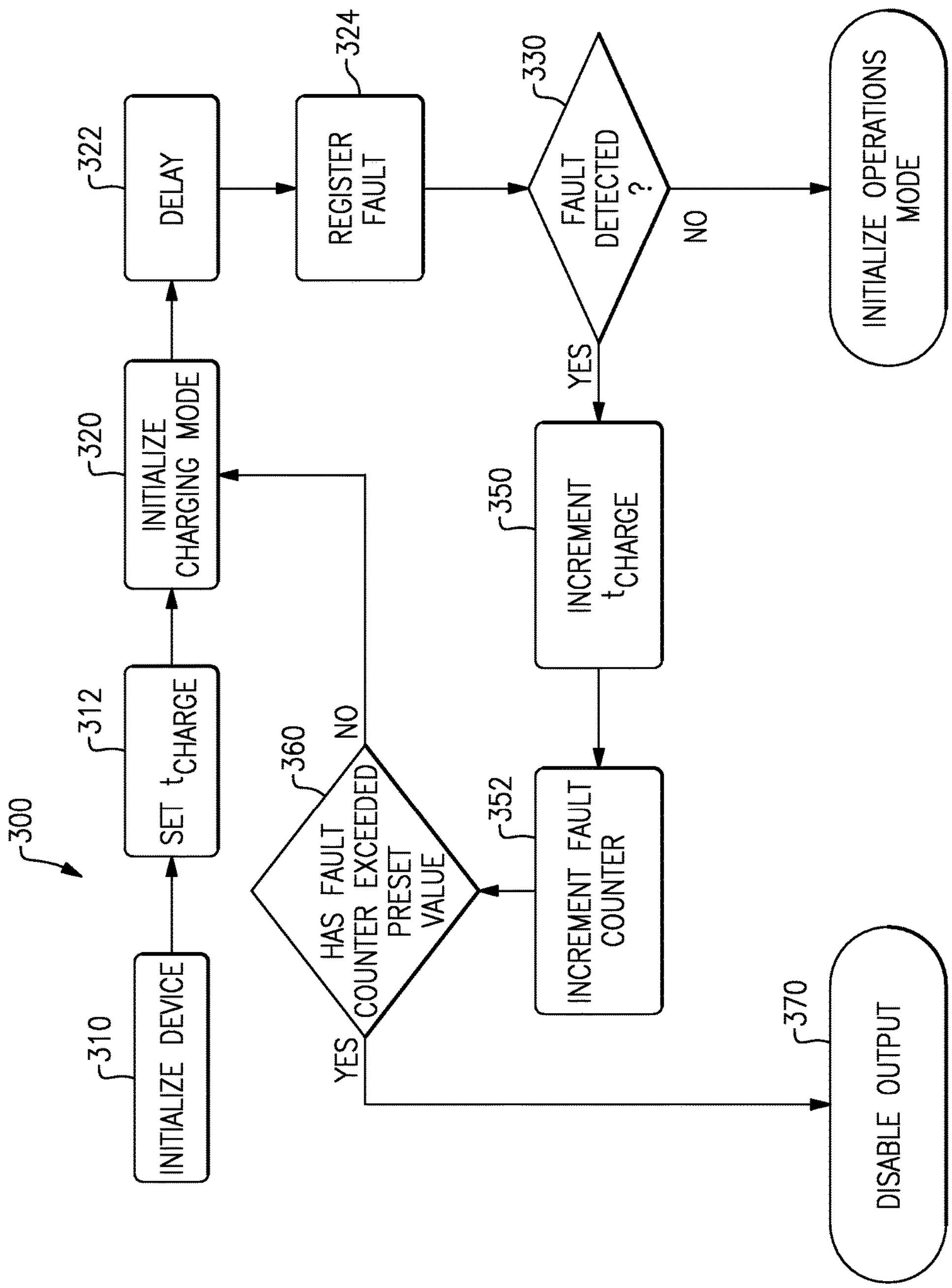
FIG. 3 illustrates a flowchart of an example method for discerning between legitimate shorts to ground and load variations.

In some example systems using the above described architecture or system, it can be difficult to discern between an actual short to ground (over-current faults) and an unexpected load variation that results in a longer than expected charging time. FIG. 3 illustrates a flowchart 300 of an example method for discerning between legitimate shorts to ground and load variations. For the exemplary method, the expected charge time is 1 ms. Practical implementations can include any expected charge time, and one of skill in the art could readily adapt the following method to accommodate for a different expected charge time.

Initially, the controller 50 and the integrated circuit 24 (illustrated in FIG. 1) configure the high side driver 20 as described above with regards to FIG. 1 at an "Initialize Device" step 310. During the initialization, the controller 50 sets the expected charging time at a "set $t_{charge}$" step 312. In this example, the charge time is set to 1 ms.

Once the high side driver is configured, the controller begins the charging mode of operations, as described above, in an "Initialize Charging Mode" step 320. The integrated circuit 24 operates in the charging mode of operations for a time period equal to or greater than the expected time period $t_{charge}$ during a "Delay" step 322. Once the time period of the delay has elapsed, and while still operating in the charging mode of operations, a fault detection system is allowed to check for a fault at a "Register Fault" step 324.

If no fault is detected by the fault detection system, the controller proceeds through a "Fault Detected" branching step 330 to an "Initialize Operations Mode" step 340. During the Initialize Operations Mode step 340, the integrated circuit 24 raises the duty cycle of the PWM signal and operates in the operational mode described above with regards to FIG. 1.

If a fault is detected by the fault detection system 70, the controller 50 proceeds through the "Fault Detected?" branching step 330 to an "Increment $t_{charge}$" step 350. During the increment $t_{charge}$ step 350, the duration of $t_{charge}$ is increased by a present value. In some examples, the preset value can be 10% of the previous $t_{charge}$. In alternative examples, the preset value can be 10% of the initial $t_{charge}$ value. Once the $t_{charge}$ value is increased, a fault counter is incremented by one in an "Increment Fault Counter" step 352. The fault counter can be stored in a controller memory 50 or a local memory within the integrated circuit 24.

Once the fault counter has been incremented, the system checks to determine if the fault counter has exceeded a preset number in a "Has Fault Counter Exceeded Preset Value" check 360. If the preset value has been exceeded, the system detects the legitimate presence of a short to ground (over-current fault) and disables the output of the high side driver 20 at a "Disable Output" step 370. If the fault counter has not exceeded the preset value, the system returns to the Initialize Charging Mode step 320, and continues as described above.

It is further understood that any of the above described concepts can be used alone or in combination with any or all of the other above described concepts. Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. A controller for operating a high side output driver comprising:

a first control logic configured to operate a high side output driver in a charging mode by outputting a pulse width modulated voltage signal, an on time of the pulse width modulated voltage signal being less than a minimum value of a blank time range of the high side output driver, wherein an off time of the pulse width modulated voltage output is configured such that a load of the high side output driver discharges less in the off time than is charged in the on time.

2. The controller of claim 1, further comprising: a second control logic configured to set the blank time range of the high side output driver to a maximum blank time range while operating the high side output driver in an initialization mode.

3. The controller of claim 2, wherein operating the high side output driver in the initialization mode includes setting the on time of the pulse width modulated voltage signal to less than a minimum value of the maximum blank time range.

4. The controller of claim 2, wherein the first control logic is further configured to transition from the charging mode to a standard operations mode by increasing a duty cycle of the pulse width modulated voltage signal such that the on time of the pulse width modulated voltage signal exceeds the minimum value of the maximum blank time range.

5. The controller of claim 4, wherein the duty cycle of the pulse width modulated voltage signal during the standard operations mode is 100%.

6. The controller of claim 4, wherein the transition occurs in response to the load of the high side output driver reaching a fully charged state.

7. The controller of claim 4, wherein the transition occurs in response to a charge time elapsing.

8. The controller of claim 4, wherein current at a voltage output of the high side output driver is current limited such that the current at the voltage output is below an excess current threshold during the standard operations mode.

9. The controller of claim 8, wherein the excess current threshold is above an expected maximum current.

10. The controller of claim 1, where the controller is a programmable controller including a memory, the memory including instructions operable to cause the high side output driver to enter an initialization mode, configure the high side output driver for the charging mode, enter the charging mode, and transition to a standard operations mode.

11. The controller of claim 1, further comprising:

a second control logic configured to set a blank time range of the high side output driver to a maximum blank time range while operating the high side output driver in an initialization mode, and configured to set the on time of the pulse width modulated voltage signal to less than a minimum value of the maximum blank time range.

12. A high side output driver comprising:

a driver circuitry having an output circuit configured to output a voltage, and a current limiting circuit connecting the output circuit to a voltage output; and a controller controllably coupled to the driver circuitry and including a processor and a memory, the memory storing instructions configured to cause the processor to perform the steps of:

initializing the high side output driver;

configuring the high side driver for a charging mode;

operating the high side output driver in the charging mode following the initializing and the configuring; and operating the high side output driver in a standard operations mode following operating the high side output driver in the charging mode.

13. The high side output driver of claim 12, wherein the output circuit includes a transistor connecting a voltage source to an input of the current limiting circuit while in a closed state, and a control input connected to the controller.

14. The high side output driver of claim 12, wherein the controller further includes a fault detector.

15. A method for detecting a fault condition in a high side output driver comprising:

initializing the high side output driver by at least setting a charge time;

placing the high side output driver in a charging mode of operations, and operating the high side output driver in the charging mode for at least the charge time;

comparing an output current of the high side output driver against a fault current threshold when the charge time has elapsed;

incrementing a fault counter in response to a fault being detected;

returning to the step of placing the high side output driver in the charging mode of operations in response to the fault counter being less than or equal to a preset value.

16. The method of claim 15, further comprising determining that a fault exists in response to said fault counter exceeding a preset value, and disabling an output of the high side output driver.

17. The method of claim 15, further comprising determining that no fault exists in response to the output current of the high side output driver being less than the fault current threshold when the charge time has elapsed.

18. The method of claim 15, further comprising increasing a duration of the charge time by a preset magnitude in response to the output current exceeding the fault current threshold.

* * * * *